United States Patent
Shibata et al.

(10) Patent No.: US 6,782,615 B2
(45) Date of Patent: Aug. 31, 2004

(54) METHOD OF SURFACE-MOUNTING ELECTRONIC COMPONENTS

(75) Inventors: Kazutaka Shibata, Kyoto (JP); Tsunemori Yamaguchi, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 09/204,123

(22) Filed: Dec. 2, 1998

(65) Prior Publication Data

US 2001/0015286 A1 Aug. 23, 2001

(30) Foreign Application Priority Data

Dec. 2, 1997 (JP) .............................................. 9-331600

(51) Int. Cl.[7] .............................. H05K 3/02; H05K 3/10
(52) U.S. Cl. .............................. 29/846; 29/825; 29/832; 174/250; 174/260; 361/767; 361/768; 361/777
(58) Field of Search ................................ 174/254, 256, 174/250, 260; 361/767, 768, 777; 29/825, 840, 846, 832, 866

(56) References Cited

U.S. PATENT DOCUMENTS

| | | | | |
|---|---|---|---|---|
| 4,774,634 A | * | 9/1988 | Tate et al. .................. | 361/760 |
| 5,545,281 A | * | 8/1996 | Matsui et al. ............. | 156/273.7 |
| 5,651,179 A | * | 7/1997 | Bessho et al. ............. | 29/832 |
| 5,820,716 A | * | 10/1998 | Tuttle ......................... | 156/85 |

* cited by examiner

Primary Examiner—Rick Kiltae Chang
(74) Attorney, Agent, or Firm—Beyer Weaver & Thomas LLP

(57) ABSTRACT

A plurality of electronic components having conductive connecting members are surface-mounted to a target surface of a circuit board by specifying terminal-forming areas that are each no greater than the corresponding one of the electronic components and each include at least one terminal part such that at least one of these terminal-forming areas includes a plurality of terminal parts directly and that each pair of the terminal parts within any one of the terminal-forming areas is closer to each other than any pair of the terminal parts in different ones of the terminal-forming areas. An anisotropic conductive layer is formed on this target surface so as to span these terminal-forming areas, and the plurality of electronic components are placed on this anisotropic conductive layer individually above the plurality of terminal-forming areas. As the layer is heated, these electronic components are pressed against the layer such that the conductive connecting members of the electronic components become attached to and electrically conductive with corresponding ones of the terminal parts on the circuit board. The anisotropic conductive layer remains electrically insulative elsewhere.

14 Claims, 6 Drawing Sheets

METHOD OF SURFACE-MOUNTING ELECTRONIC COMPONENTS

BACKGROUND OF THE INVENTION

This invention relates to the technology of efficiently surface-mounting electronic components such as various kinds of semiconductor devices and elements onto a target surface, for example, of a printed circuit board.

As is well known, the so-called solder reflow method is usually used for surface-mounting a plurality of semiconductor devices and elements to a printed circuit board. According to this method, after a solder paste is applied to the surface of terminal-forming areas prepared on the printed circuit board and the semiconductor devices and elements are placed thereon, the circuit board is placed inside a heating oven to cause the solder paste to reflow. This method is convenient because the soldering of a plurality of semiconductor devices can be carried out at once together by heating and melting the solder paste applied at various positions on the printed circuit board. This prior art method, however, has several disadvantages.

Firstly, the solder paste must be applied to the surface of the terminal-forming areas with a high degree of accuracy by using a printing machine. If the solder paste spills over too much from the target surface, there may result an incomplete connection of conductors. In summary, the application of solder paste is a very troublesome work, and this problem is particularly serious where solder paste must be applied at a large number of places. Secondly, this method requires that the printed circuit board be kept inside the heating oven until its temperature reaches the melting temperature of the solder. Thus, electronic components with poor heat resistance cannot be preliminarily mounted to the circuit board. In other words, the order of mounting various components onto the circuit board must be carefully planned such that components with poor heat resistance will not be subjected to a long heating process inside a heating oven.

SUMMARY OF THE INVENTION

It is therefore an object of this invention in view of the above to provide a more convenient and efficient method of surface-mounting electronic components to a target surface of a printed circuit board.

A method embodying the invention, by which the above and other objects can be accomplished, may be characterized as comprising the steps of forming an anisotropic conductive layer on the target surface, placing the electronic components on this layer such that their conductive connecting members are individually above the terminal parts in specified terminal-forming areas of the surface, and pressing these electronic components to the anisotropic conductive layer such that corresponding pairs of these conductive connecting members and the terminal parts become mutually attached and electrically conductive through this anisotropic conductive layer while the remaining portions of the layer remain electrically insulative. Such an anisotropic conductive layer may be formed either by attaching a single sheet of an anisotropic conductive film of a thermosetting synthetic resin having conductive particles dispersed therein or by applying an anisotropic conductive adhesive similarly having conductive particles dispersed inside a thermosetting resin material. This layer is preferably heated as the electronic components are pressed against it so as to become advantageously hardened.

The method of this invention is advantageous because the surface-mounting of electronic components to a target surface can be carried out securely and dependably. The anisotropic conductive layer can be melted and softened by heating as a plurality of electronic components are pressed against it. As the heating temperature is increased, the softened anisotropic conductive layer can be hardened more quickly by the thermosetting characteristic of the material than if it were left to naturally become hardened. This invention therefore relates also to surface-mounted structures produced by a method of this invention as described above.

BRIEF DESCRIPTION OF THE DRAWINGS

The accompanying drawings, which are incorporated in and form a part of this specification, illustrate embodiments of the invention and, together with the description, serve to explain the principles of the invention in the drawings.

DETAILED DESCRIPTION OF THE INVENTION

Figure 1:
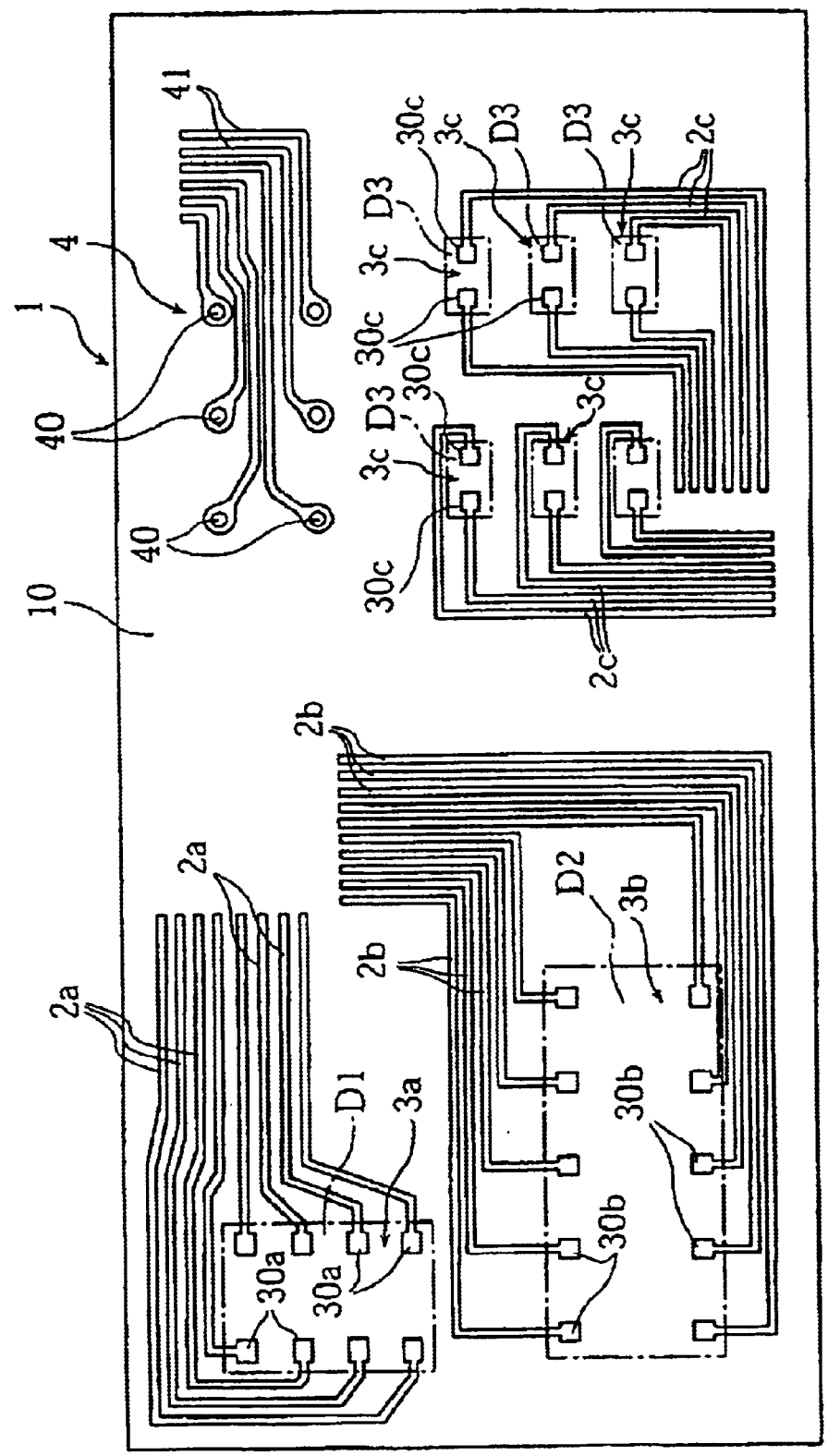
FIG. 1 is a plan view of a printed circuit board to which a method of this invention may be applied.

FIG. 1 shows a printed circuit board 1 to which a method of this invention is applicable, being a rectangular plate made of a synthetic resin material such as glass epoxy resin or another kind of insulating material. Numeral 10 indicates a surface of the circuit board 1 to which electronic components are intended to be surface-mounted. A wiring pattern is formed on this surface 10 with a copper foil or the like for making connections to such electronic components.

Explained more in detail, there are formed on the surface 10 of the printed circuit board 1 two terminal-forming areas 3a and 3b for surface-mounting two semiconductor devices D1 and D2 (to be described below) and a plurality of other terminal-forming areas 3c for surface-mounting a plurality of semiconductor elements D3 (also to be described below). The area 3a is characterized as having planar rectangular terminal parts 30a positioned according to a specified arrangement at the ends of a plurality of conductive lines 2a. The area 3b is similarly characterized as having planar terminal parts 30b at the ends of another plurality of conductive lines 2b positioned according to another specified arrangement. The areas 3c include planar terminal parts 30c (positioned according to still another specified arrangement) at the ends of still another plurality of conductive lines 2c.

It is to be noted that the terminal parts 30a in the terminal-forming area 3a for surface-mounting the device D1 and the terminal parts 30b in the terminal-forming area 3b for surface-mounting the device D2 are distributed differently on the surface 10 of the printed circuit board 1. Explained more in detail, according to this example, the device D1 is area wise much smaller than the device D2 and the terminal-forming area 3a is much smaller than the terminal-forming area 3b. At least in part for this reason, the terminal parts 30a are more densely distributed within the terminal-forming area 3a than the terminal parts 30b within the terminal-forming area 3b. In other words, the terminal parts (30a, 30b, 30c and possibly others) are distributed over the surface 10 of the printed circuit board 1 not necessarily in a uniform manner but in general in a non-uniform manner, depending on the properties such as the size of the devices (D1, D2, D3 and possibly others) that may be mounted thereon and where they are to be mounted thereon.

Numeral 4 in FIG. 1 indicates another mounting area on the surface 10 of the printed circuit board 1 for mounting one or more electronic components by other than a surface-mounting method such as by inserting pins. Numerals 40 indicates holes formed at the ends of a plurality of conductive lines 41 for inserting pin-shaped terminals of electronic components thereinto. In FIG. 1, it is particularly to be noted that the terminal parts 30a, 30b and 30c are formed in clusters such that those of the terminal parts 30a, 30b and 30c within a same one of the terminal-forming areas 3a, 3b and 3c are closer together than those in different ones thereof.

Similar terminal-forming and/or mounting areas may be formed on the reverse surface of the printed circuit board 1. For the convenience of description, methods of mounting electronic components on such a circuit board will not be separately described because those of mounting on the reverse surface are identical to those of mounting on the surface 10.

Figure 2A:
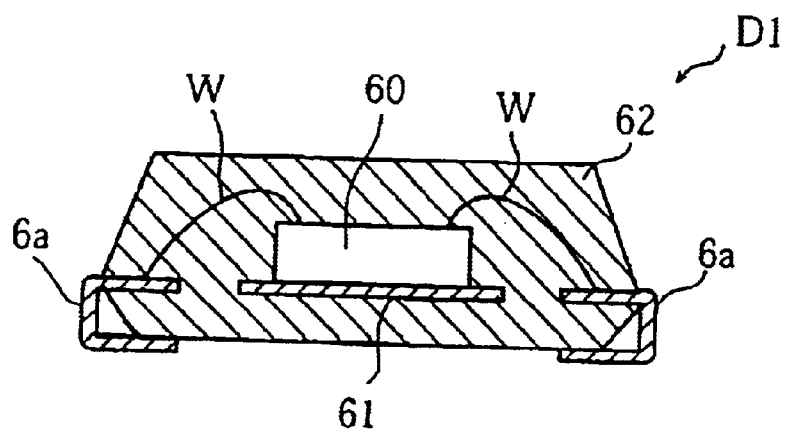
FIGS. 2A, 2B and 2C are cross-sectional and diagonal views of electronic components which may be surface-mounted by a method of this invention.
Figure 2B:
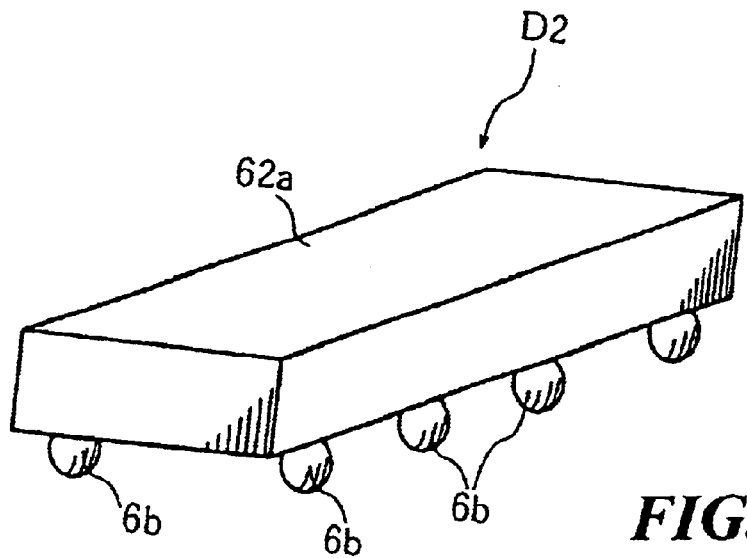
Figure 2C:
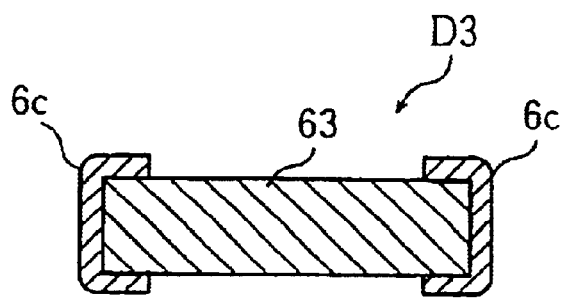

The semiconductor devices and elements D1, D2 and D3 are shaped respectively as shown in FIGS. 2A, 2B and 2C so as to be convenient for surface-mounting, each having conductive connecting members serving as terminals or electrodes for the surface-mounting. Explained more in detail, FIG. 2A shows the semiconductor device D1 of a so-called resin-packaged J-lead type, having a semiconductor chip 60 bonded on a die pad 61 and connected through wires W to a plurality of lead terminals 6a, and a sealing resin material 62 covering the wires W and the semiconductor chip 60 to form a resin package. The lead terminals 6a are bent so as to be cross-sectionally J-shaped such that their edges are positioned on the bottom surface of this sealing resin-material 62. These-edge parts are utilized for the surface-mounting.

FIG. 2B shows the semiconductor device D2 of a so-called ball grid array type. It is formed, like the device D1 described above, with a semiconductor chip packaged inside a resin material 62a but is different wherein a plurality of protruding terminals 6b are formed on the bottom surface of its sealing resin 62a with solder balls. The semiconductor device D2 thus structured may be soldered to a circuit board but it can also be surface-mounted by a method according to this invention.

FIG. 2C shows one of the semiconductor elements D3 produced as a chip resistor or a chip capacitor, having metallic electrodes 6c formed on both side surfaces of a semiconductor chip 63. These electrodes 6c are formed in a step-like manner, swelling outwardly from the surface of the semiconductor chip 63 such that the semiconductor elements D3 can be surface-mounted by directly attaching these electrodes 6c on the target surface.

Figure 3:
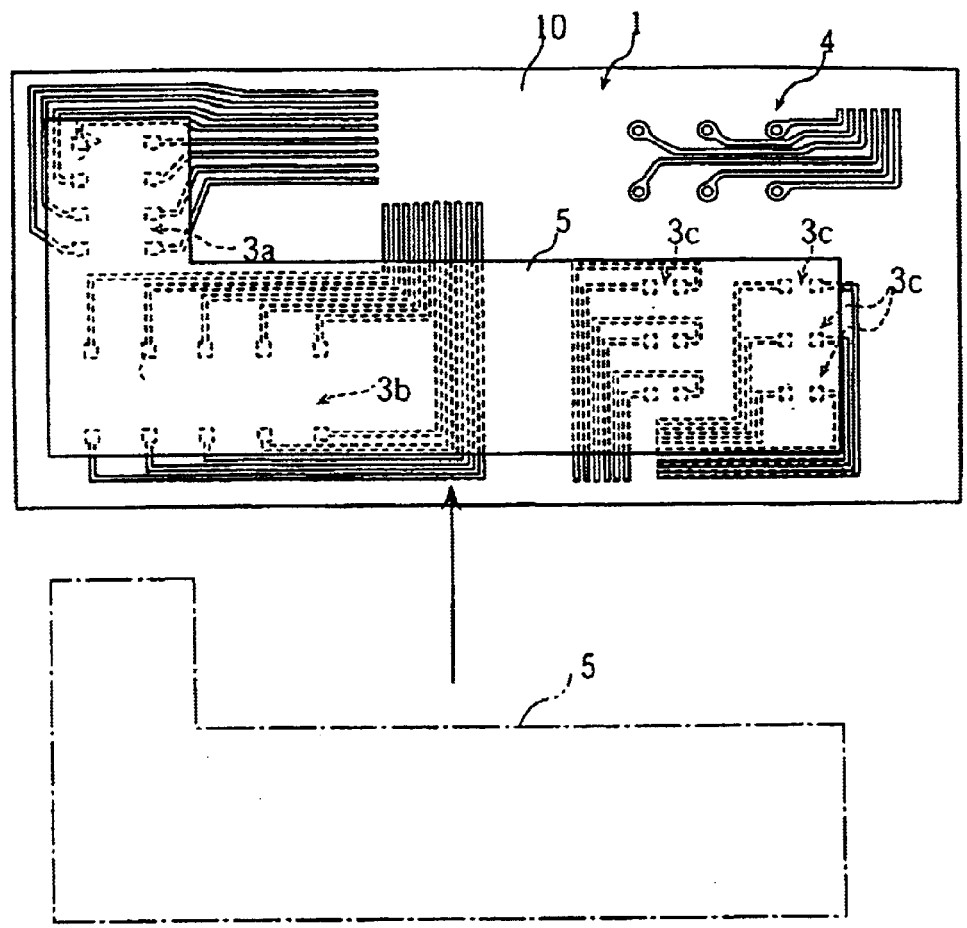
FIG. 3 is a plan view of the printed circuit board of FIG. 1 during a surface-mounting process according to this invention.

For surface-mounting these semiconductor devices and elements D1, D2 and D3 on the surface 10 of the printed circuit board 1, a sheet of anisotropic conductive film 5 is attached first to the surface 10, as shown in FIG. 3. As shown more clearly in FIG. 5, this anisotropic conductive film 5 may be obtained by distributing electrically conductive particles 51 such as metallic particles inside a film with a thermosetting characteristic such as a synthetic epoxy resin film. These conductive particles 51 are dispersed inside the film 5 such that the film 5 is normally not electrically conductive. When a sufficiently strong compressive force is applied to this film 5 in the direction of its thickness, however, the density of these conductive particles 51 is increased where the force is applied. As these conductive particles 51 come to contact one another, the portions of the film 5 where such a force is applied become conductive. According to the embodiment of the invention described herein, the anisotropic conductive film 5 placed over the printed circuit board 1 serves as what is, herein referred to as "the anisotropic conductive layer".

As shown in FIG. 3, the anisotropic conductive film 5 is of a size and shape so as to cover a fairly large area of the surface 10 of the printed circuit board 1 such that all of the plurality of terminal-forming areas 3a, 3b and 3c are covered together but care is taken so as to keep the area 4 uncovered thereby and exposed. The anisotropic conductive film 5 is "attached" to the surface 10 of the printed circuit board 1, but this does not mean that an affirmative effort is made to paste it to the surface 10. The act of simply placing the film 5 over the surface 10 is intended to be included although it is preferable to make some effort to make the film 5 to stick to the surface 10 such that no displacement will take place inadvertently.

Figure 4:
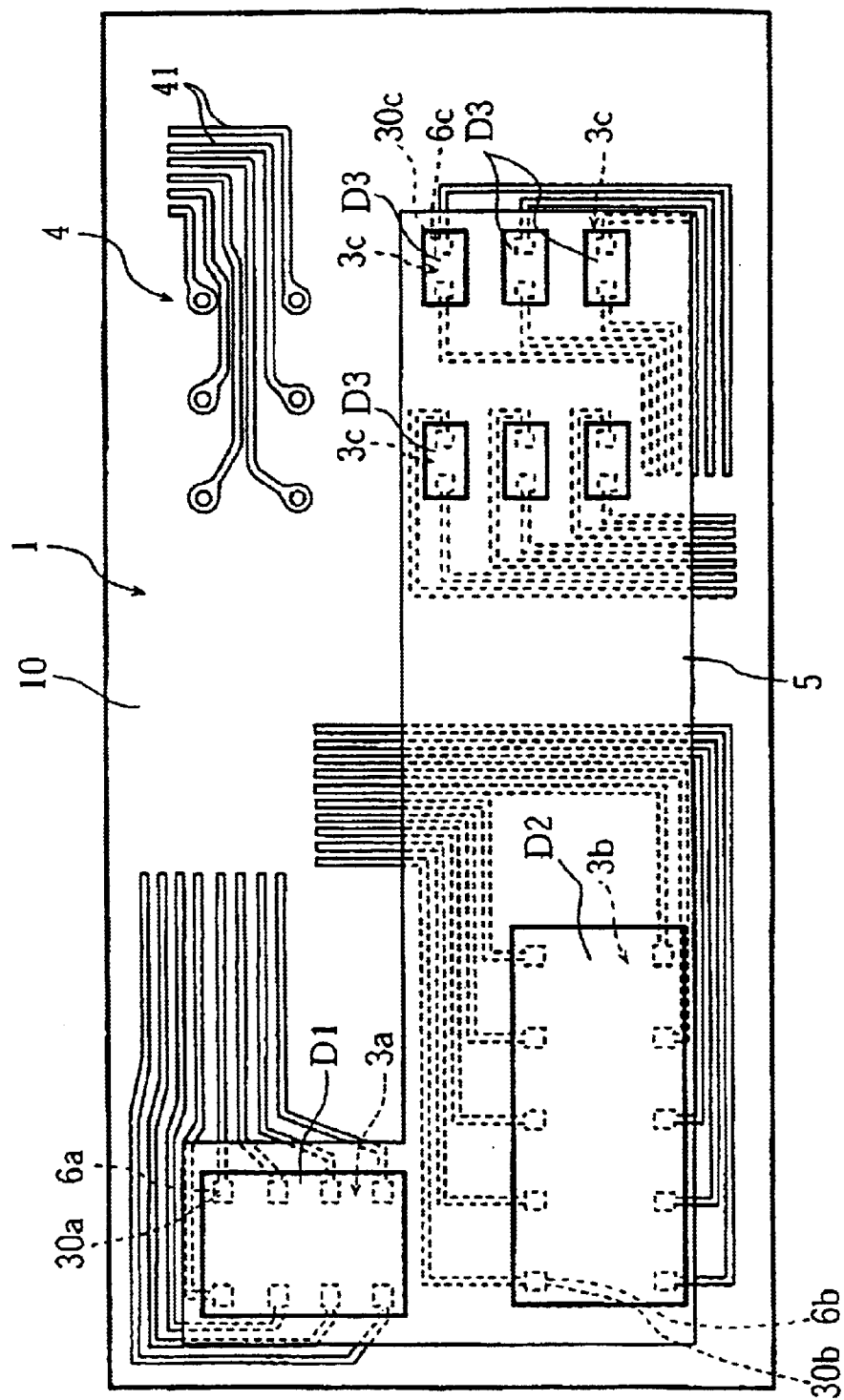
FIG. 4 is a plan view of the printed circuit board of FIG. 1 on which the electronic elements of FIGS. 2A, 2B and 2C are being surface-mounted.
Figure 5:
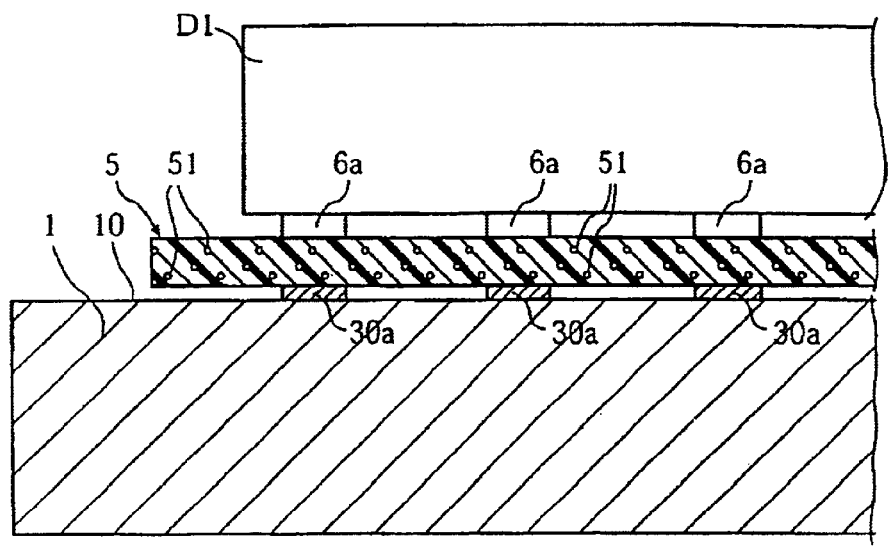
FIG. 5 is a sectional view of a portion of the printed circuit board of FIG. 4 on which the electronic component of FIG. 2A is placed for surface-mounting.
Figure 6:
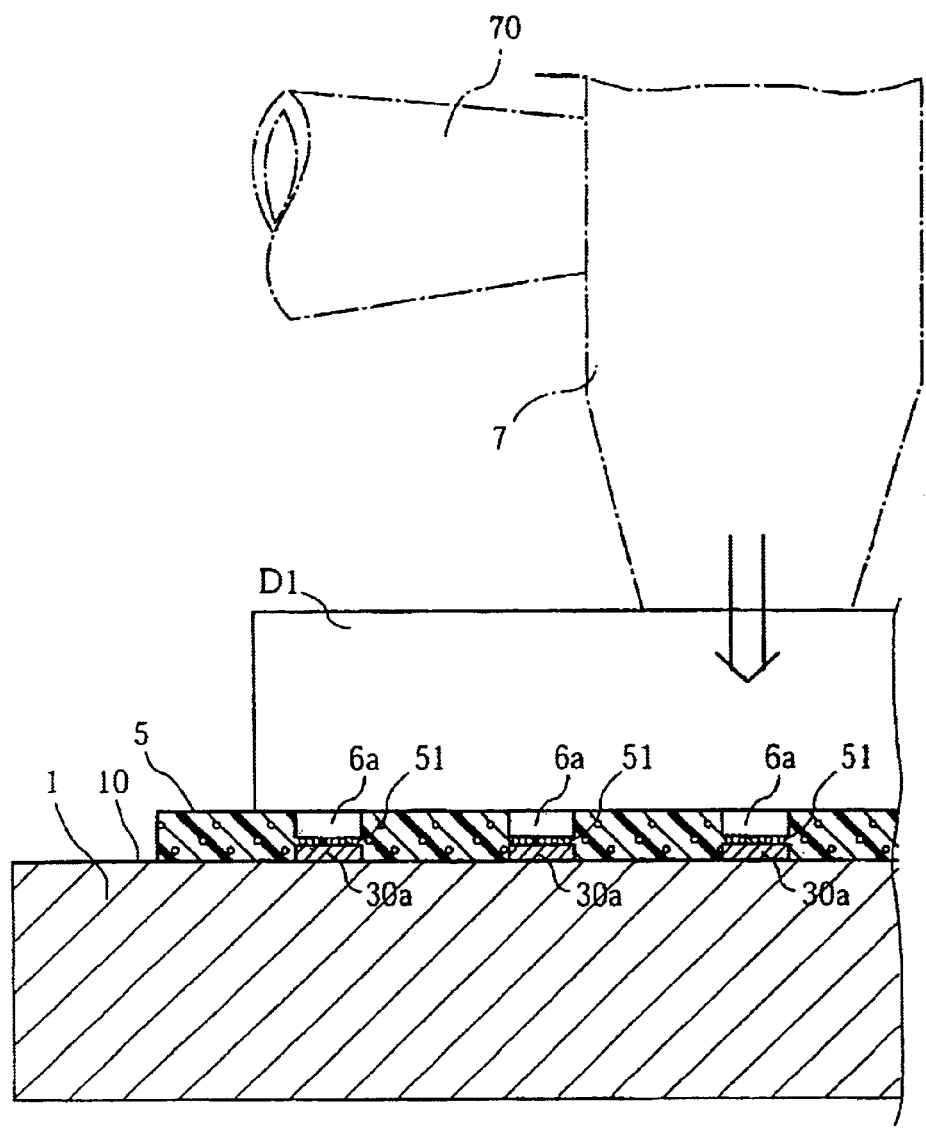
FIG. 6 is another sectional view of the portion of the printed circuit board of FIG. 4 after the electronic component of FIG. 2A has been surface-mounted.

Thereafter, the semiconductor devices and elements D1, D2 and D3 are placed on the anisotropic conductive film 5 as shown in FIGS. 4 and 5. The device D1 is positioned such that its lead terminals 6a will be correspondingly above the terminal parts 30a in the terminal-forming area 3a. The device D2 is positioned such that its lead terminals 6b will be correspondingly above the terminal parts 30b in the terminal-forming area 3b. Similarly, the elements D3 are positioned such that their lead terminals 6c will be correspondingly above the terminal parts 30c in the terminal-forming area 3c. These devices and elements D1, D2 ad D3 are pressed downward while the film 5 is heated. In FIG. 6, numeral 7 indicates a collet 7 which may be used to place the device D1 on the film 5. In such a case, the collet 7 may be used conveniently for pressing the device D1 against the film 5. For heating the film 5, a heater may be placed beneath the printed circuit board 1. Alternatively, a heater may be incorporated in whatever component serving to press the device D1 against the film 5. As the device D1 is being pressed against the film 5, ultrasonic waves generated in a horn 70 attached to the collet 7 may be additionally made use of.

As a result of such heating, the film 5 becomes softer and portions thereof between the lead terminals 6a and the corresponding terminal parts 30a are subjected to a compressive force such that the conductive particles 51 in these portions come to contact one another between the surfaces of the lead terminals 6a and those of the terminal parts 30a, causing these lead terminals 6a to become in electrical conductive relationship with corresponding ones of the terminal parts 30a. By applying ultrasonic waves to such portions, the contacts between the lead terminals 6a and the terminal parts 30a can be made even more secure and intimate. Since the other portions of the film 5 are not subjected to any compressive force and the conductive particles 51 remain dispersed, they remain electrically nonconductive. In summary, as far as the device D1 is concerned, only its lead terminals 6a become conductive with the terminal parts 30a. The other portions of the lower surface of the device D1 contact the surface 10 of the printed circuit board 1 through the softened film 5, or more accurately through its softened resin material. The resin material of the film 5 can be hardened by increasing the heat applied to it. Thus, the device D1 can be securely attached to the printed circuit board 1 by this method. It now goes without saying that similar effects can be obtained also with the other device D2 and the elements D3.

In summary, the surface-mounting work according to this invention is very simple, including only the steps of attaching a sheet of anisotropic conductive sheet at specified positions on the surface of a printed circuit board and then mounting electronic components thereon. As a result, the cost of the final product obtained by such a simple process becomes lower. Moreover, since the portions of the film where nothing is mounted serve as an insulating layer after the anisotropic conductive film is subjected to a heating process, the product thus obtained is better insulated.

Figure 7A:
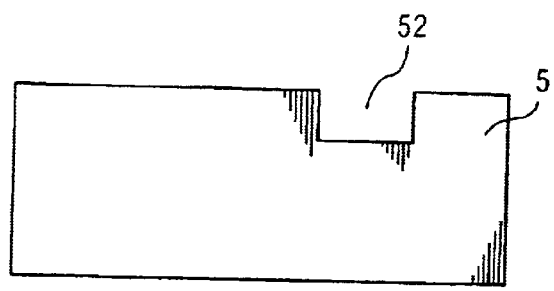
FIGS. 7A and 7B are plan views of anisotropic conductive sheets embodying this invention.
Figure 7B:
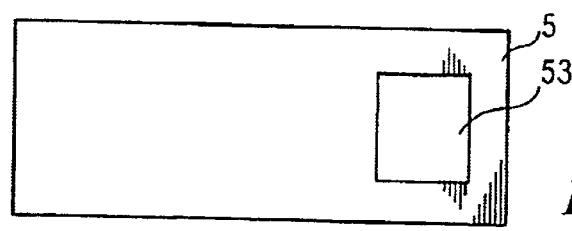

The invention has been described above with reference to only one example, but this example is not intended to limit the scope of the invention. Many modifications and variations are possible within the scope of this invention. FIGS. 7A and 7B show other anisotropic conductive films 5 shaped differently. FIG. 7A shows an example characterized as having a removed edge portion 52 and FIG. 7B shows another example characterized as having an opening. With the anisotropic conductive sheet 5 thus shaped variously, positions of areas on a printed circuit board to be covered by the film can be freely adjusted. It should be reminded, however, that the present invention is not limited to the use of only one sheet of w anisotropic conduct sheet. If the surface-mounting area of an electronic device is very large or its shape is very complicated, the anisotropic conductive film to be used according to this invention may be divided into a plurality of sheets. The present invention is particularly advantageous, however, when a sheet of anisotropic conduct sheet is set so as to span and cover a plurality of terminal-forming areas.

Neither is the present invention limited to the use of an isotropic conductive film sheet in order to form an anisotropic conductive layer. Instead of an anisotropic conductive film, use may equally well be made of an anisotropic conductive adhesive agent. Such an anisotropic conductive adhesive agent may be one obtainable by dispersing conductive particles inside a synthetic resin adhesive agent such as thermosetting epoxy resin. An anisotropic conductive layer according to this invention may be formed by applying such an adhesive agent on the surface of a printed circuit board. Such an anisotropic conductive adhesive agent need not be heated because it already has the property of causing the electronic device to become attached to the surface of the circuit board but the mounted condition of the electronic device can be more quickly stabilized if this anisotropic conductive adhesive agent is heated than if it is allowed to harden naturally.

It also goes without saying that the present invention is not limited by the type of electronic components which are mounted. As long as the electronic components are of a kind provided with connecting conductors for use at the time of mounting such as terminals or electrodes.

What is claimed is:

1. A method of surface-mounting a plurality of electronic components having conductive connecting members, said method comprising the steps of:

providing a target surface having a plurality of specified terminal-forming areas thereon, each of said specified terminal-forming areas being no greater than corresponding one of said electronic components and including at least one terminal part therein, at least one of said terminal-forming areas including a plurality of terminal parts directly thereon such that each pair of said terminal parts within any one of said terminal-forming areas is closer to each other than any pair of said terminal parts in different ones of said terminal-forming areas;

forming an anisotropic conductive layer on said target surface so as to span said plurality of terminal-forming areas;

placing said plurality of electronic components on said anisotropic conductive layer individually above said plurality of terminal-forming areas; and pressing said plurality of electronic components to said anisotropic conductive layer so as to thereby cause said conductive connecting members of said plurality of electronic components to individually become adhered to and in electrically conductive relationship with a corresponding one of said terminal parts through said anisotropic conductive layer.

2. The method of claim 1 wherein said anisotropic conductive layer is formed by attaching a single sheet of anisotropic conductive film to said target surface, said anisotropic conductive film containing conductive particles dispersed inside a thermosetting synthetic resin.

3. The method of claim 1 wherein said anisotropic conductive layer is formed by applying an anisotropic conductive adhesive to said target surface, said anisotropic conductive adhesive containing conductive particles dispersed inside a thermosetting synthetic resin.

4. The method of claim 2 wherein said anisotropic conductive layer is heated as said plurality of electronic components are pressed to said anisotropic conductive layer.

5. The method of claim 3 wherein said anisotropic conductive layer is heated as said plurality of electronic components are pressed to said anisotropic conductive layer.

6. The method of claim 2 further comprising the step of preparing said single sheet of anisotropic conductive film in a shape according to positions and shapes of said terminal-forming areas of said target surface.

7. The method of claim 4 further comprising the step of preparing said single sheet of anisotropic conductive film in a shape according to positions and shapes of said terminal-forming areas of said target surface.

8. A surface-mounted structure comprising:

a circuit board with a surface having thereon a plurality of terminal-forming areas each containing terminal parts therein;

a plurality of electronic components having conductive connecting members thereon; and an anisotropic conductive layer between and attached to both said surface of said circuit board and said plurality of electronic components, said anisotropic conductive layer being thermally hardened, electrically conductive individually between said terminal parts and corresponding ones of said conductive connecting members of said plurality of electronic components, and being electrically insulative elsewhere.

9. The surface-mounted structure of claim 8 wherein said anisotropic conductive layer comprises conductive particles dispersed inside a thermosetting synthetic resin.

10. A method of surface-mounting a plurality of electronic components having conductive connecting members, said method comprising the steps of:

providing a target surface having a plurality of specified terminal-forming areas thereon, each of said specified terminal-forming areas being no greater than corresponding one of said electronic components and including at least one terminal part therein, at least one of said termninal-forming areas including a plurality of terminal parts directly thereon such that each pair of said terminal parts within any one of said terminal-forming areas is closer to each other than any pair of said terminal parts in different ones of said terminal-forming areas, wherein the terminal parts are distributed in a non-uniform manner depending on the sizes of said terminal-forming areas;

forming an anisotropic conductive layer on said target surface so as to span said plurality of terminal-forming areas;

placing said plurality of electronic components on said anisotropic conductive layer individually above said plurality of terminal-forming areas; and pressing said plurality of electronic components to said anisotropic conductive layer so as to thereby cause said conductive connecting members of said plurality of electronic components to individually become adhered to and in electrically conductive relationship with a corresponding one of said terminal parts through said anisotropic conductive layer.

11. The method of claim 10 wherein said anisotropic conductive layer is formed by attaching a single sheet of anisotropic conductive film to said target surface, said anisotropic conductive film containing conductive particles dispersed inside a thermosetting synthetic resin.

12. The method of claim 11 wherein said anisotropic conductive layer is heated as said plurality of electronic components are pressed to said anisotropic conductive layer.

13. The method of claim 11 further comprising the step of preparing said single sheet of anisotropic conductive film in a shape according to positions and shapes of said terminal-forming areas of said target surface.

14. The method of claim 12 further comprising the step of preparing said single sheet of anisotropic conductive film in a shape according to positions and shapes of said terminal-forming areas of said target surface.

* * * * *